United States Patent
Jacobs et al.

(10) Patent No.: US 11,506,802 B2
(45) Date of Patent: Nov. 22, 2022

(54) MULTI-PIECE MONO-LAYER RADIATION DETECTOR

(71) Applicant: KONINKLIJKE PHILIPS N.V., Eindhoven (NL)

(72) Inventors: Johannes Wilhelmus Maria Jacobs, Boxtel (NL); Rolf Karl Otto Behling, Norderstedt (DE); Roger Steadman Booker, Aachen (DE); Gereon Vogtmeier, Aachen (DE); Onno Jan Wimmers, Valkenswaard (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 17/274,258

(22) PCT Filed: Sep. 10, 2019

(86) PCT No.: PCT/EP2019/074036
§ 371 (c)(1),
(2) Date: Mar. 8, 2021

(87) PCT Pub. No.: WO2020/053174
PCT Pub. Date: Mar. 19, 2020

(65) Prior Publication Data
US 2021/0356608 A1  Nov. 18, 2021

(30) Foreign Application Priority Data
Sep. 10, 2018 (EP) .................................. 18193337

(51) Int. Cl.
*G01T 1/36* (2006.01)
*G01T 1/20* (2006.01)
(Continued)

(52) U.S. Cl.
CPC ............ *G01T 1/36* (2013.01); *G01T 1/20181* (2020.05); *G01T 1/20184* (2020.05);
(Continued)

(58) Field of Classification Search
CPC ... G01T 1/36; G01T 1/20184; G01T 1/20181; G01T 1/242; G01T 1/2928; G01T 1/2985; H01L 31/0256
See application file for complete search history.

(56) References Cited

U.S. PATENT DOCUMENTS 11,147,522 B2 * 10/2021 Cai ......................... G01T 1/247
2002/0054954 A1   5/2002 Otto
(Continued)

FOREIGN PATENT DOCUMENTS

DE       102007058447 A1    6/2009

OTHER PUBLICATIONS

PCT International Search Report, International application No. PCT/EP2019/074036, dated Oct. 17, 2019.

*Primary Examiner* — David P Porta
*Assistant Examiner* — Jeremy S Valentiner
(74) *Attorney, Agent, or Firm* — Larry Liberchuk (57) ABSTRACT

The present invention relates to a radiation detector (100) comprising: i) a substrate (110); ii) a sensor, which is coupled to the substrate, the sensor comprising a first array (120) of sensor pixels, a second array (130) of signal read-out elements, and an electronic circuitry which is configured to provide image data based on signals received from the signal read-out elements; iii) a transducer, which is coupled to the substrate and to the sensor, the transducer comprising a third array (140) of subpixels, wherein at least two subpixels are assigned to one sensor pixel; wherein the second array of signal read-out elements and the third array
(Continued)

of subpixels correspond to each other; wherein each of the subpixels comprises a radiation conversion material.

14 Claims, 7 Drawing Sheets

(51) Int. Cl.
    *H01L 31/0256*    (2006.01)
    *G01T 1/29*    (2006.01)
    *G01T 1/24*    (2006.01)

(52) U.S. Cl.
    CPC ............ *G01T 1/242* (2013.01); *G01T 1/2928* (2013.01); *G01T 1/2985* (2013.01); *H01L 31/0256* (2013.01)

(56) References Cited

U.S. PATENT DOCUMENTS

| | | | |
|---|---|---|---|
| 2008/0205585 A1 | 8/2008 | Proksa | |
| 2010/0135463 A1* | 6/2010 | Kang | G01T 1/2018 |
| | | | 250/370.11 |
| 2010/0282972 A1 | 11/2010 | Carmi | |
| 2011/0133094 A1* | 6/2011 | Seppi | A61B 6/032 |
| | | | 250/336.1 |
| 2013/0051521 A1 | 2/2013 | Basu | |
| 2017/0322320 A1 | 11/2017 | Jacobs | |
| 2017/0350993 A1* | 12/2017 | Shahar | G01T 1/244 |

\* cited by examiner

Top view side view

Conventional pixel array

New: array of 3x3 pixels

FIG. 4

Standard: subjects with same materials and same thickness:

Subpixels with different materials, but same thickness:

| 22 | 23 | 24 | 25 | 10 |
|---|---|---|---|---|
| 21 | 8 | 9 | 2 | 11 |
| 20 | 7 | 1 | 3 | 12 |
| 19 | 6 | 5 | 4 | 13 |
| 18 | 17 | 16 | 15 | 14 |

Subpixels with same material, but different thickness:

Subpixels with different materials, but different thickness:

Subpixels with different sizes:

| 8 | 9 | 2 |
|---|---|---|
| 7 | 1 | 3 |
| 6 | 5 | 4 |

Variation of gaps between subpixels:

FIG. 5

Different materials:

1x2:   1x3:

1x4:

2x2:

Different materials and thickness:

1x2:   1x3:

1x4:

2x2:

2x3:

Different materials and thickness:

MULTI-PIECE MONO-LAYER RADIATION DETECTOR

FIELD OF THE INVENTION

The invention relates to large-area pixelated radiation detectors, in particular the present invention relates to a radiation detector.

BACKGROUND OF THE INVENTION

In recent years, new advanced X-ray and computed tomography, CT, applications are emerging, which require advanced imaging features such as spectral, also "multi-energy", imaging, higher dynamic range and higher spatial resolution. Examples are for instance spectral CT, spectral X-ray, differential phase contrast imaging, DPCI, dark field X-ray, DAX, imaging, and so-called multi-modality XSPECT imaging, a complete integration of SPECT single photon emission computed tomography—and CT data during image reconstruction for sharp clinical detail and accurate measurement of disease.

Current X-ray and CT detectors have limited performance and cannot meet the required specification levels to enable these new applications at acceptable cost levels.

US 2002/054954 A1 describes a multidimensional detector array for detecting electromagnetic radiation, wherein a layer composite is produced, which has a sensor layer with a material sensitive to the radiation, and a carrier layer.

US 2010/0282972 A1 describes an indirect radiation detector for detecting radiation, the detector comprising: an array of pixels, each pixel being sub-divided into at least a first and a second sub-pixel, each sub-pixel having a cross-sectional area parallel to a surface plane of the array of pixels.

SUMMARY OF THE INVENTION

There may be a need to facilitate the design and manufacture the radiation conversion in indirect or direct conversion detectors.

This need is met by the subject-matter of the independent claims. Further exemplary embodiments are evident from the dependent claims and the following description.

A first aspect of the invention relates to a radiation detector comprising a substrate and a sensor, which is coupled to the substrate, the sensor comprising: —a first array of sensor pixels; —a second array of signal read-out elements; and —an electronic circuitry which is configured to provide image data based on signals received from the signal read-out elements.

The radiation detector further comprises a transducer, which is coupled to the substrate and to the sensor, the transducer comprising: a third array of subpixels, wherein at least two subpixels are assigned to one sensor pixel. The second array of signal read-out elements and the third array of subpixels correspond to each other, wherein each of the subpixels comprises a radiation conversion material.

The restriction that the second array of signal read-out elements and the third array of subpixels correspond to each other may be understood that the array correspond in size of the array as defined by the number of rows and columns that it contains.

The present invention advantageously uses the assembly concept of color display technologies for realization of (large-area) pixelated radiation detectors, i.e. replacing the flat panel display technology, as for instance realized by the so-called "microLED" by a radiation conversion material for X-ray/γ-ray detection and replacing the receiving substrate by a pixelated read-out sensor.

In the coming years the large display industry will rapidly develop the required process assembly technology and equipment for LED die (pick-and-place) transfer from donor substrates to receiving substrates.

Based on the present invention, medical detector suppliers can then easily re-use the developed microLED technologies to realize cost-effective manufacturing of multi-piece radiation detectors. A similar transfer of key enabling technologies occurred in the past for current a-Si and CMOS flat panel detectors, derived from respective displays, LCDs, and semiconductors, CMOS image sensors.

According to an embodiment of the invention, at least one of the signal read-out elements is a photodiode and the radiation conversion material of each of the subpixels is a scintillator; wherein a composition of the radiation conversion material and/or a thickness of the radiation conversion material is varied between at least two subpixels assigned to one sensor pixel.

According to an embodiment of the invention, the composition of the radiation conversion material to be varied between the at least two subpixels assigned to one sensor pixel is at least one of the following: i) a doping level of the radiation conversion material, ii) a doping material, and/or iii) a combination of doping materials.

According to an embodiment of the invention, the radiation conversion material is the radiation conversion material is caesium iodide, optionally doped with thallium, lutetium iodide, optionally doped with cerium, gadolinium oxysulfide, optionally doped with terbium or optionally doped with praseodymium, calcium tungstate, lutetium-yttrium oxyorthosilicate, sodium iodide, zinc sulfide, scintillating garnet materials such as lutetium gadolinium gallium garnet, yttrium aluminum garnet, or bismuth germanium oxide.

According to an embodiment of the invention, at least one of the signal read-out elements is a conductive electrode and the radiation conversion material of each of the subpixels is a photoconductor, wherein a composition of the photoconductor and/or a thickness the photoconductor is varied between at least two subpixels assigned to one sensor pixel.

According to an embodiment of the invention, the composition of the photoconductor to be varied between the at least two subpixels assigned to one sensor pixel is at least one of the following: i) a doping level of the photoconductor ii) a doping material, and/or iii) a combination of doping materials.

According to an embodiment of the invention, the photoconductor is at least one of the following: i) amorphous selenium, ii) cadmium zinc telluride, iii) cadmium telluride, iv) perovskite, v) gallium arsenide, vi) mercury(II)iodide, vii) lead(II) oxide, viii) thallium(I) bromide, and ix) inorganic photoconductor nanoparticles embedded in an organic matrix.

According to an embodiment of the invention, the at least two subpixels assigned to one sensor pixel are subpixels with different dimension and/or different size and/or different distance gaps and/or different radiation conversion materials and/or different material composition between the subpixels.

According to an embodiment of the invention, the third array comprises a non-uniform distribution of the different dimension of the subpixels and/or the different size of the subpixels and/or the different distance gaps and/or the different radiation conversion materials of the subpixels and/or the different material composition between the subpixels.

For example, according to an embodiment of the invention the non-uniform distribution of subpixels may be provided by a non-uniform distribution of the composition and/or the thickness of the used radiation conversion material.

According to an embodiment of the invention, a thicker scintillator may be provided in a center region of the pixel, and a in comparison to the thicker thinner scintillator may be provided in any non-center, e.g. any periphery region of the detector.

According to an embodiment of the invention, a high-quality, expensive scintillator, for example CsI, may be provided in a center region of the pixel, and lower quality, cheap scintillator, for example GOS, may be provided in any non-center, e.g. any periphery region of the detector.

For example, according to an embodiment of the invention the non-uniform distribution of subpixels may be provided by a non-uniform distribution of level of subpixel binning, for example 4×4, 3×3, 2×2 or 1×1 binning from a center region towards a periphery of detector.

According to an embodiment of the invention, this may be achieved by using equal pixel size across the complete detector area.

According to an embodiment of the invention, an increase of pixel size from center towards periphery may be provided. This advantageously results in high spatial resolution in center and lower resolution at periphery, while saving material costs of electronics compared to a detector with 4×4 subpixel binning across complete area.

According to an embodiment of the invention, the first array of sensor pixels and/or the second array of signal read-out elements and/or the third array of subpixels is a two-dimensional array.

According to an embodiment of the invention, the first array of sensor pixels and/or the second array of signal read-out elements and/or the third array of subpixels is a one-dimensional array.

According to an embodiment of the invention, the second array of signal read-out elements and/or the third array of subpixels define a subarray scheme of the first array of sensor pixels. In other words, at least a small portion in a center region of the detector is provided with subpixels.

According to an embodiment of the invention, the second array of signal read-out elements and/or the third array of subpixels are configured to provide a spatial resolution, a spectral energy resolution, or a dynamic range or a spectral energy range.

According to an embodiment of the invention, the substrate comprises a flat or a substantially flat or a curved shape. The term "substantially flat" as used by the present invention may refer to a flatness comprising a minimum bend radius of up to 1 cm.

According to an embodiment of the invention, the substrate comprises silicon, glass or polymer foil.

Further embodiments of the invention are provided in the description for explanatory purpose. These and other aspects of the invention will be apparent from and elucidated with reference to the embodiments described hereinafter.

BRIEF DESCRIPTION OF THE DRAWINGS

A more complete appreciation of the invention and the attendant advantages thereof will be more clearly understood by reference to the following schematic drawings, which are not to scale, wherein.

In principle, identical parts are provided with the same reference symbols in the figures.

DETAILED DESCRIPTION OF EMBODIMENTS

The illustration in the drawings is schematically and not to scale. In different drawings, similar or identical elements are provided with the same reference numerals.

Generally, identical parts, units, entities or steps are provided with the same reference symbols in the figures.

Figure 1:
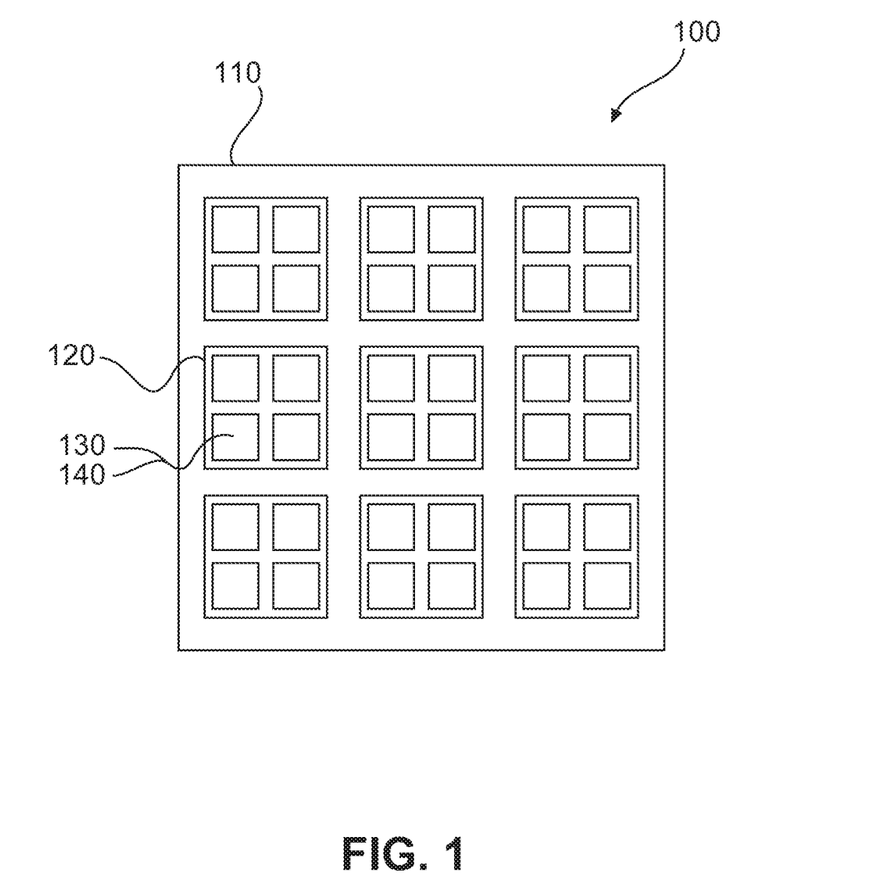
FIG. 1 shows a schematic diagram of a radiation detector according to an embodiment of the invention.

FIG. 1 shows a schematic diagram of a radiation detector according to an embodiment of the invention.

FIG. 1 shows a radiation detector 100 comprising: a substrate 110; a sensor, which is coupled to the substrate, the sensor comprising: a first array of sensor pixels 120, a second array of signal read-out elements 130; and an electronic circuitry which is configured to provide image data based on signals received from the signal read-out elements.

The radiation detector 100 further comprises a transducer, which is coupled to the substrate and to the sensor, the transducer comprising: a third array of subpixels 140, wherein for the shown embodiment of FIG. 1 four subpixels are assigned to one sensor pixel, and also four read-out elements 130 are assigned to one sensor pixel, wherein each of the subpixels comprises a radiation conversion material.

Figure 2:
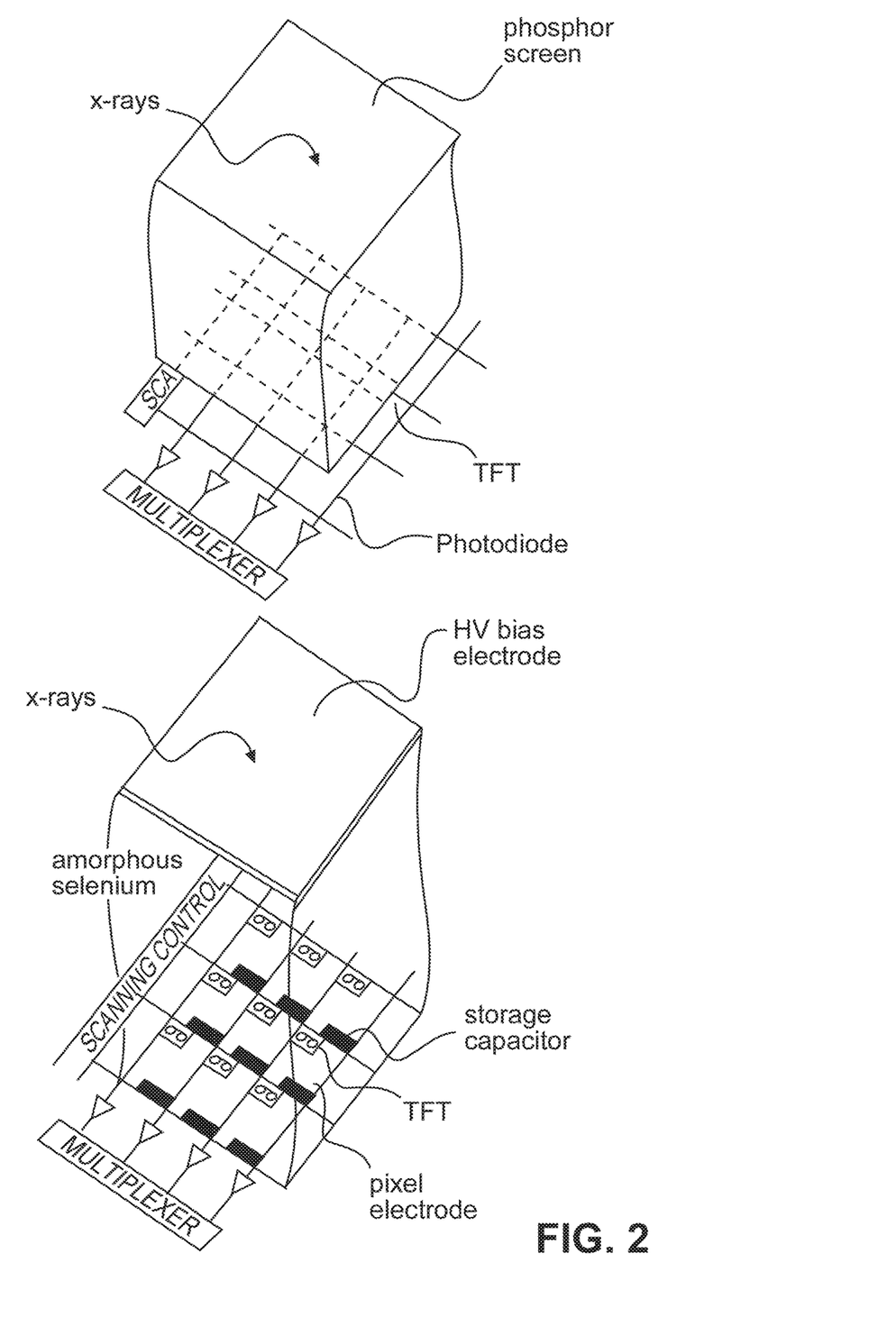
FIG. 2 shows a schematic diagram of a radiation detector with an indirect detector and a direct detector according to an embodiment of the invention.

FIG. 2 shows a schematic diagram of a radiation detector with an indirect detector and a direct detector according to an embodiment of the invention.

According to an embodiment of the invention, provided is a method to design and manufacture the radiation conversion layer in indirect or direct conversion detectors. Indirect detector as shown on the left side of FIG. 2 provide that the conversion material is formed by a scintillator, the pixel read-out element is for instance realized in terms of a photodiode.

According to an embodiment of the invention, as an alternative concept, the direct detector as shown on the right side of FIG. 2 is provided by using as the conversion material a photoconductor, the pixel read-out element is then realized in terms of a conductive electrode or in terms of metal electrode. According to an embodiment of the invention, a common HV bias electrode is applied on the opposite side of the photoconductor to realize an electric field across the photoconductor.

According to an embodiment of the invention, both detectors—direct or indirect—comprise a read-out sensor, i.e. a one-dimensional array or two-dimensional array of addressable pixels comprising at least an electronic switch and a signal read-out element.

According to an embodiment of the invention, the electronic switches may be provided in terms of thin-film transistors.

According to an embodiment of the invention, the signal read-out element is connected to a radiation conversion material which converts radiation into electrical charge (direct conversion) or photons (indirect conversion).

According to an embodiment of the invention, in a direct conversion detector the signal read-out element consist of a metal electrode connected to a photoconductor, whereas in an indirect conversion detector the signal read-out element consist of a photodiode connected to a scintillator.

According to an embodiment of the invention, the sensor and each pixel, for instance also each subpixel, may comprise additional electronic circuitry, as for instance elements like capacitors, amplifiers, comparators, analog-to-digital converter or any further digital or analog signal processing circuit.

Figure 3:
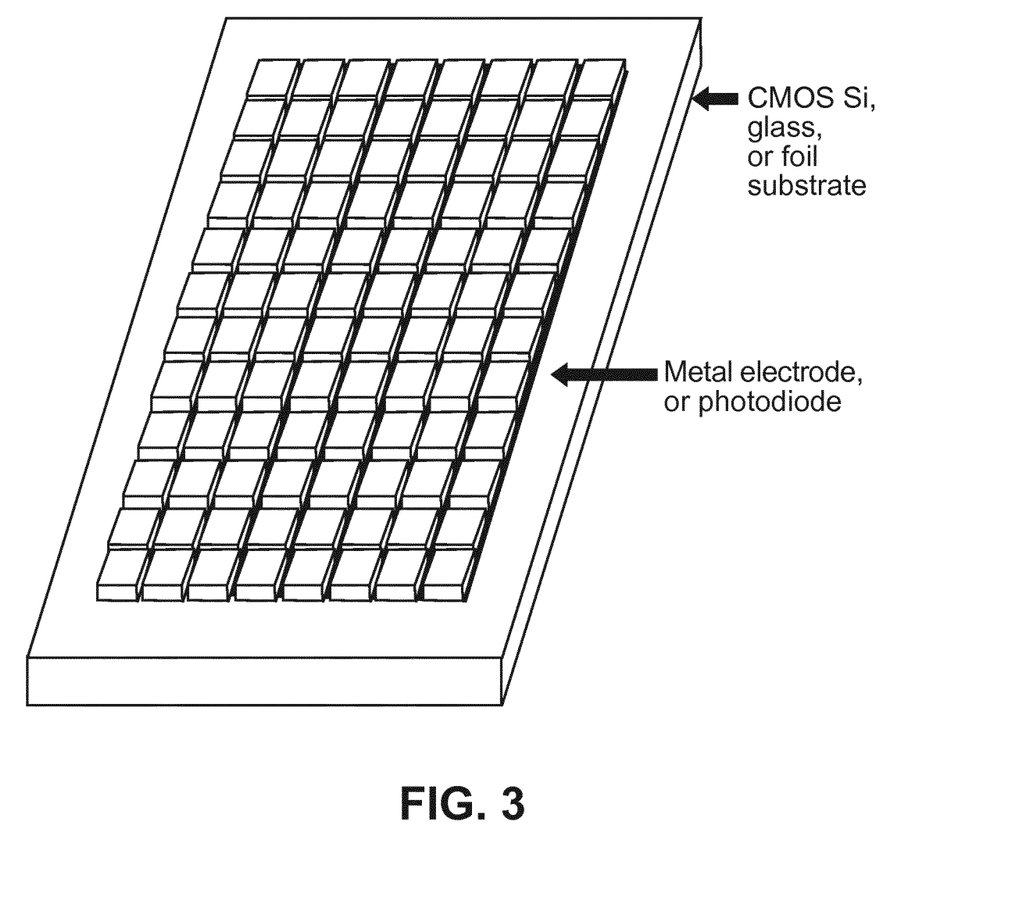
FIG. 3 shows a schematic diagram for a read-out sensor according to an embodiment of the invention.

FIG. 3 shows a schematic diagram for a read-out sensor according to an embodiment of the invention.

According to an embodiment of the invention, examples of the read-out sensor are:

i. an active pixel CMOS image sensor or a Si photodiode array; and ii. a TFT backplane, as for example amorphous Si, or indium gallium zinc oxide, IGZO, or low temperature poly silicon, LTPS, with amorphous —Si or organic photodiodes on glass or foil substrate.

In current radiation detectors, each pixel is mostly composed of a single radiation conversion material, such as a scintillator, for instance materials like cesium iodide, CsI, gadolinium oxysulfide, GOS or a photoconductor for instance materials like a-Se, cadmium telluride, CdTe, cadmium zinc telluride CZT, or further photoconductor materials.

Figure 4:
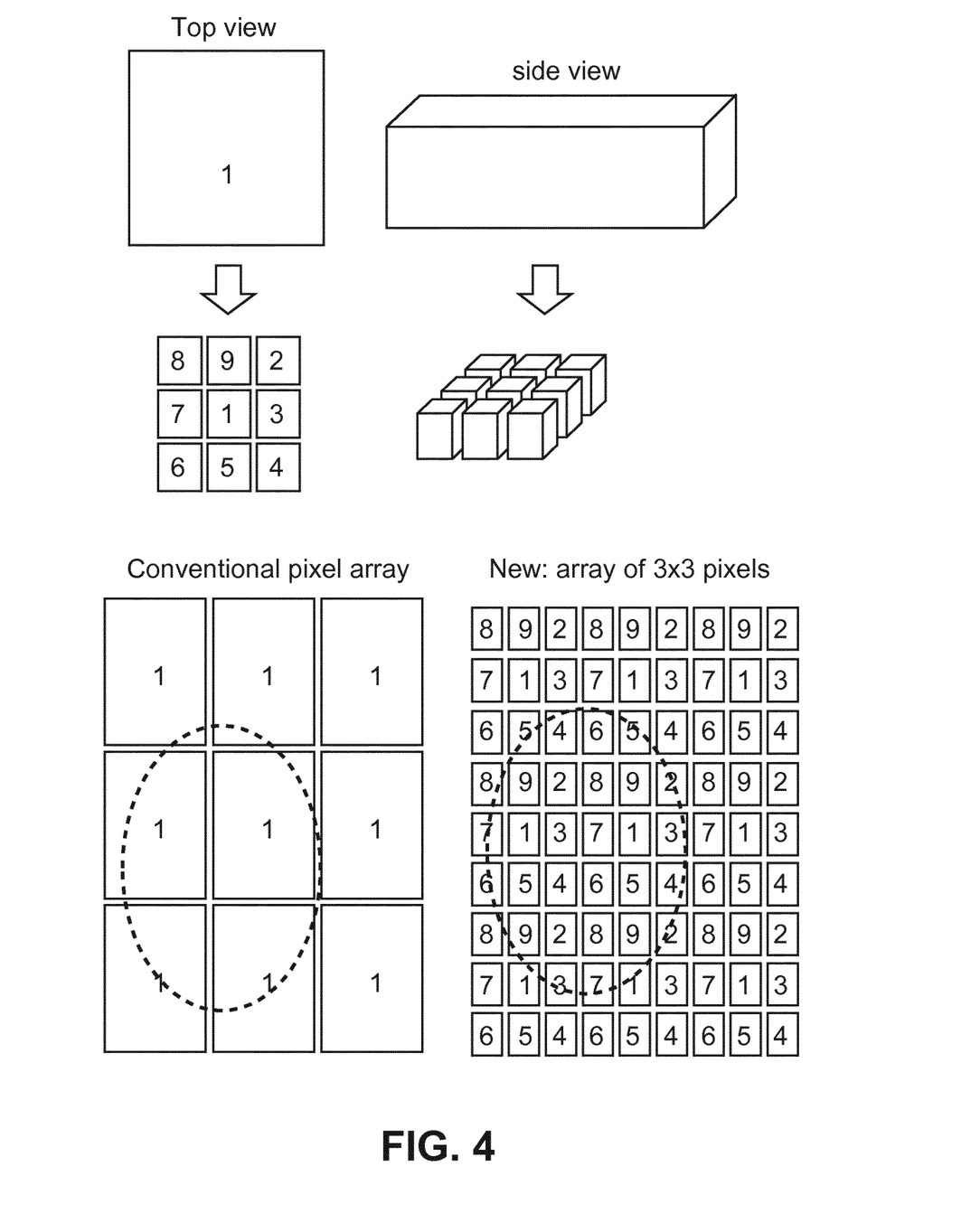
FIG. 4 shows a schematic diagram for pixel and subpixels for a radiation detector according to an embodiment of the invention.

FIG. 4 shows a schematic diagram for pixel and subpixels for a radiation detector according to an embodiment of the invention. The basic idea is to replace this standard pixel by a pixel composed of multiple small subpixels composed of different radiation conversion materials, as shown in FIG. 4.

FIG. 4 shows the approach from pixel to subpixels. Conventional detector as shown on the left provides that a pixel is composed of single conversion material. The detector as defined by the shown embodiment of the present invention provides that a pixel at least comprises multiple subpixels composed of different conversion materials. The circle depicts an incident X-ray spot on the detector.

According to an embodiment of the invention, the design of the pixels, the sensor and related detector electronics may be implemented according to demands of the radiation detector, although it will be determined to a large extent by the chosen design of the radiation conversion layer.

According to an embodiment of the invention, the signals from subpixels can be separated from each other by means of an optically reflective layer in the gap between scintillator pieces and an electrically isolating layer in the gap between photoconductor pieces.

Figure 5:
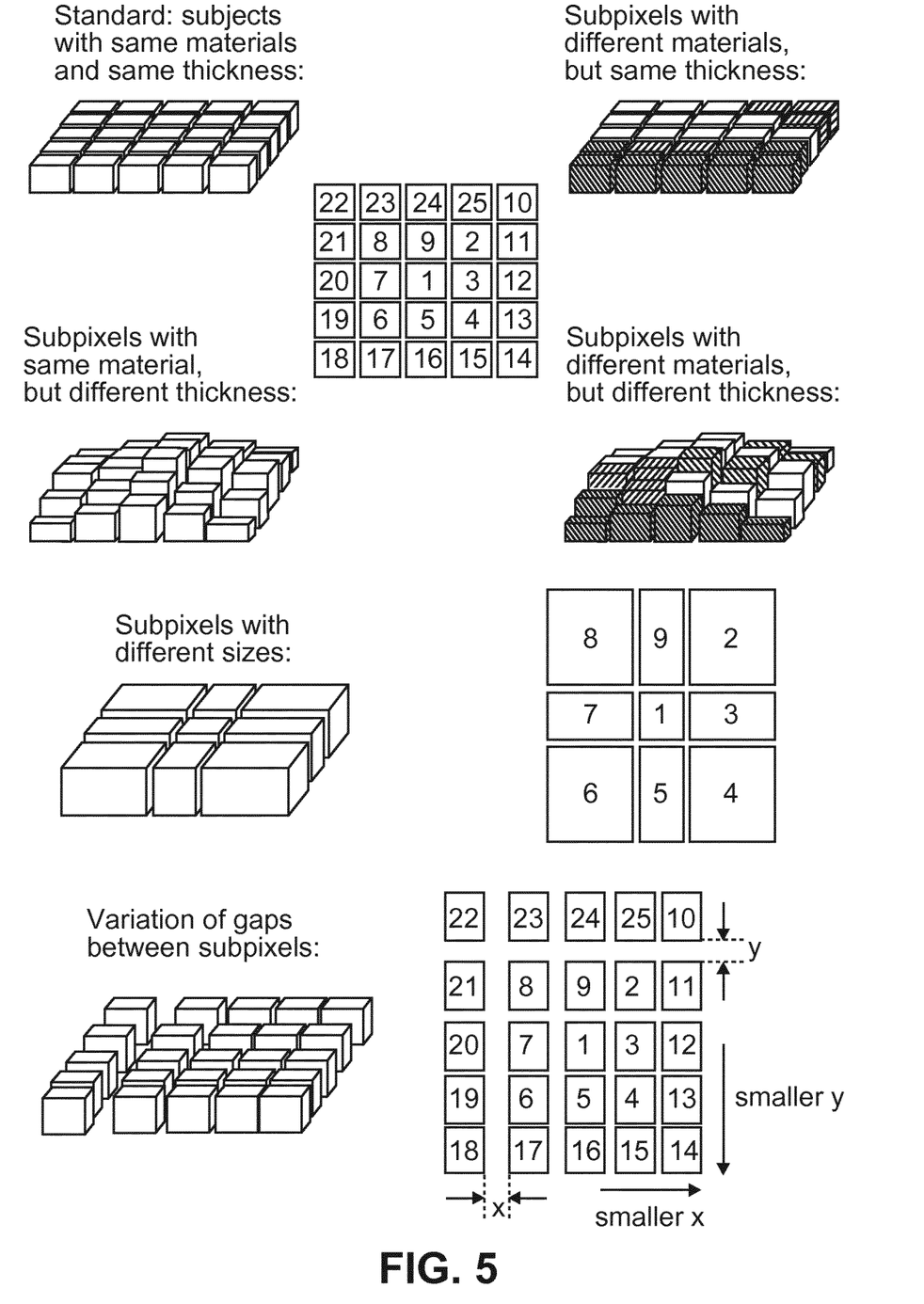
FIG. 5 shows a basic pixel and subpixel design options according to an embodiment of the invention.

FIG. 5 shows a basic pixel and subpixel design options according to an embodiment of the invention.

According to an embodiment of the invention, different pixel designs can be configured by combining subpixels according to one or more of the following basic options, as schematically illustrated in FIG. 5:

i. Subpixels with different materials, optionally, according to an embodiment also subpixels with different material composition, but same thickness;

ii. Subpixels with same material but different thickness;

ii. Subpixels with different materials, optimally, according to an embodiment also subpixels with different material composition, and different thickness;

iv. Subpixels with different sizes in x-y direction;

v. Subpixels with different distance (gaps in x-y direction) between each other.

According to an embodiment of the invention, each subpixel may be individually capable of receiving image data signals from the piece of radiation conversion material to which it is connected. Each signal of a subpixel may be processed as in a standard detector to form an output image that can be transferred to a data handling unit for further image processing.

According to an embodiment of the invention, alternatively, multiple signals from subpixel(s) within a pixel and/or neighboring pixel(s) are binned together to form an output image. In this way, pixel designs can be configured to improve one or more specific functions or performance features of the detector, such as spatial resolution, spectral energy resolution, dynamic range or spectral energy range.

According to an embodiment of the invention, for example, the circle in FIG. 4 illustrates that spatial resolution increases at decreasing size of subpixels. Spectral energy resolution can be increased by choosing a wide range of thicknesses and/or types of conversion materials for different subpixels within a pixel. By combining large with small subpixels the dynamic range of the detector can be improved.

According to an embodiment of the invention, the detectable spectral energy spectrum can be determined by selecting a set of different conversion materials, each with a specific energy absorption characteristic, to cover a desired energy range.

For the requirement of a spatial resolution for an X-ray or a CT detector, for instance, smaller subpixels are provided with different dedicated scintillators or photoconductor materials. This may be used in applications like DPCI or DAX imaging, direct fringe measurements or for achieving small and smallest pixels for X-ray or a CT system.

For the requirement of a spectral differentiation or resolution for an X-ray or a CT detector, for instance, subpixels are provided with a large variation of different dedicated scintillators or photoconductor materials. This may be used in applications like tissue differentiation, material detection and separation, or non-invasive measurements of X-ray tube characteristics for instance an X-ray spot size, or an X-ray spectrum of an X-ray or a CT imaging system.

According to an embodiment of the invention, for the requirement of a dynamic differentiation or resolution for an X-ray or a CT detector, for instance, subpixels are provided with a combination of small and large subpixels, e.g. the size of at least two subpixels may be varied within one pixel. This may be used in applications like high contrast images of medical tissue or objects with very large differences in the material X-ray absorption characteristics.

According to an embodiment of the invention, also hybrid counting may be applied and integrating detectors may be used, also pixels or subpixels with alternating photoconductor type or material or doping may be used and scintillator materials for photon counting in the low dose regime and charge integration for the high dose regime may be used, wherein low dose regime defines a dose regime below a certain specified threshold value and high dose regime defines a dose regime above a further, specified threshold value.

A further approach may be based on using a hybrid X-ray and γ-ray detector, wherein pixels or subpixels with different scintillator or photoconductor materials and/or thicknesses are used for combined X-ray and SPECT imaging.

Figure 6:
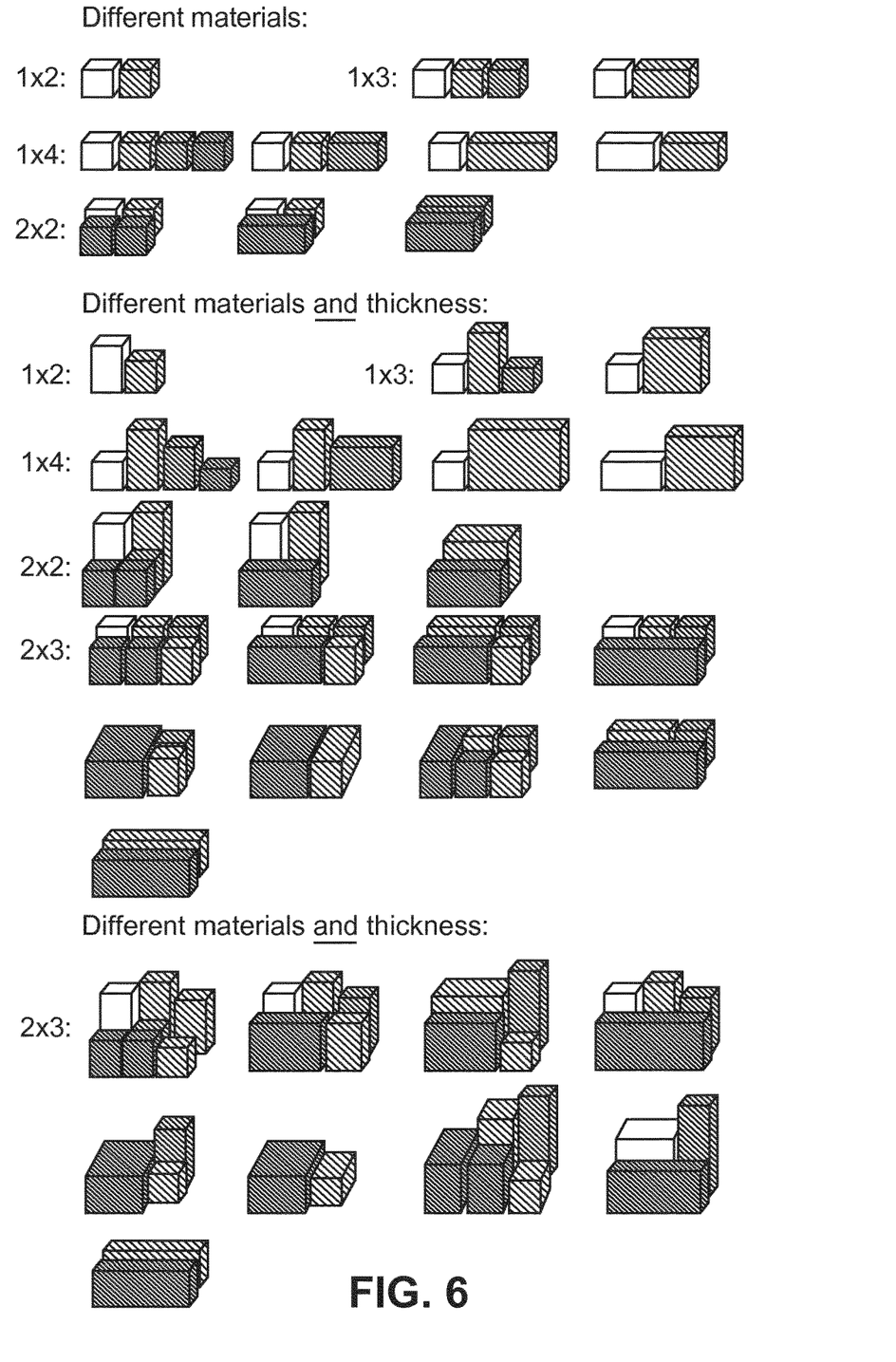
FIG. 6 shows a schematic diagram for different pixel designs derived from base grids of 1×2, 1×3, 1×4, 2×2 and 2×3 subpixels according to an embodiment of the invention.

FIG. 6 shows a schematic diagram for different pixel designs derived from base grids of 1×2, 1×3, 1×4, 2×2 and 2×3 subpixels according to an embodiment of the invention.

FIG. 6 illustrates that the number of possible different pixel designs increases rapidly when the number of subpixels in a pixel increases. For example, for a pixel composed of 2×3 subpixels on a base two-dimensional grid with fixed sizes, already 9 different pixel designs are possible when only subpixel binning and material type as design parameters are being varied. It is clear that the number of possible different pixel designs becomes infinite, when also material thickness, subpixel sizes and distance gaps between subpixels are being varied.

Figure 7:
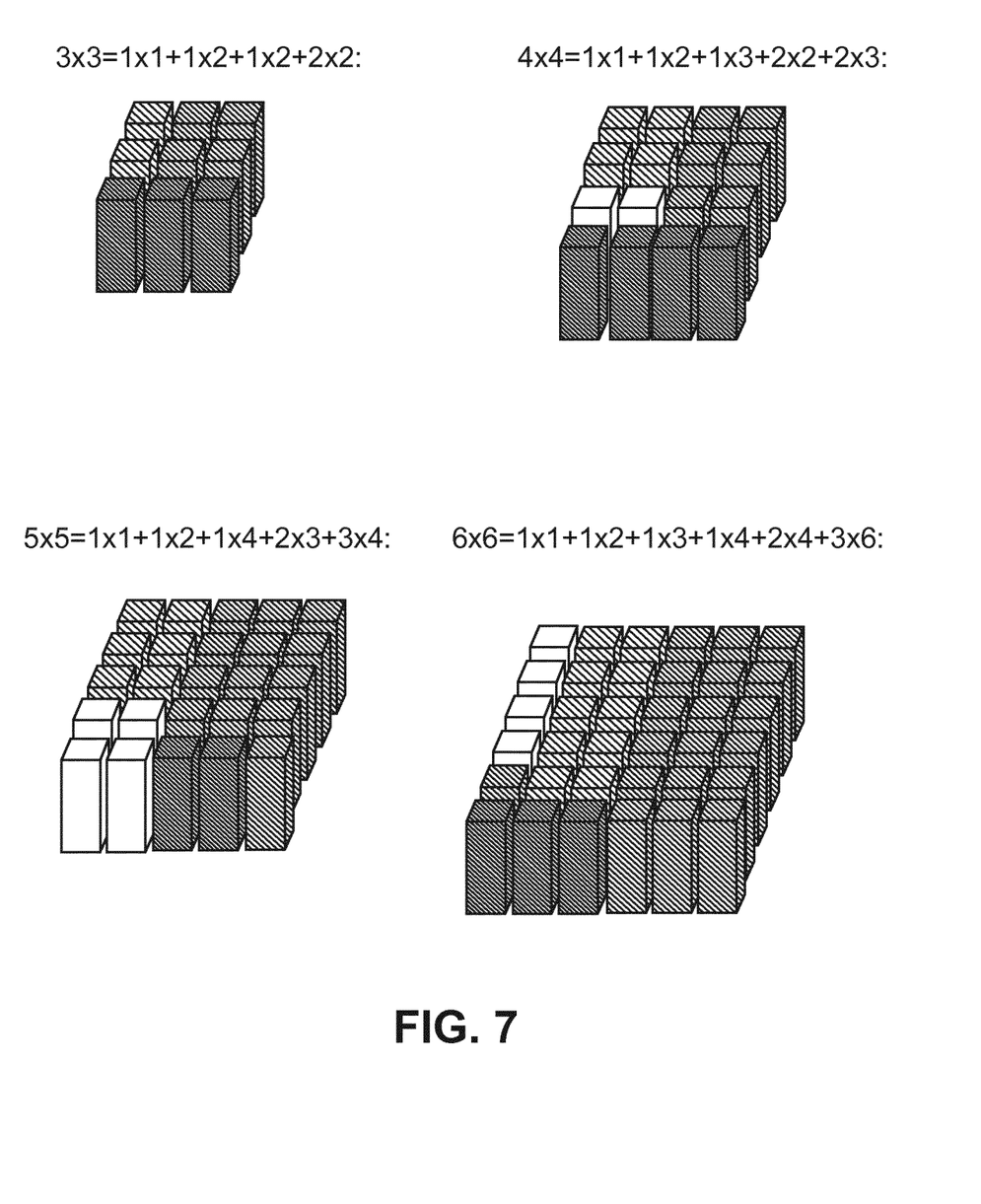
FIG. 7 shows a schematic diagram for different pixel designs derived from base 2D grids of 3×3, 4×4, 5×5, and 6×6 subpixels according to an embodiment of the invention.

FIG. 7 shows a schematic diagram for different pixel designs derived from base two-dimensional, 2D, grids of 3×3, 4×4, 5×5, and 6×6 subpixels according to an embodiment of the invention.

FIG. 7 shows, for each base two-dimensional grid of 3×3, 4×4, 5×5, and 6×6 subpixels, an illustrative combination of subpixels that creates a pixel with very high dynamic range, HDR. Subpixels with the same pattern can be either electronically binned or physically combined to a larger subpixel.

According to an embodiment of the invention, for example, from the base two-dimensional grid of 6×6 subpixels a HDR pixel can be configured composed of six subpixels with increasing surface areas (1, 2, 3, 4, 8, and 18) in order to ensure sufficient overlap in electrical gain.

According to an embodiment of the invention, for X-ray and CT detectors we anticipate that subpixel sizes may range between 5 μm and 1 mm, and preferably between 10 μm and 100 μm.

According to an embodiment of the invention, the pick-and-place assembly method may enable manufacturing of a non-uniform detector composed of a sensor with different pixel areas or a gradient in surface area properties, e.g. increasing pixel size or subpixel size from center towards edges or decreasing pixel size or subpixel size from center towards edges.

According to an embodiment of the invention, it is also possible to design a hybrid detector composed of pixels or subpixels with alternating photoconductor and scintillator materials for single photon counting, e.g. a low dose regime, and charge integration, in a high dose regime.

According to an embodiment of the invention, a standard detector may be provided with only a certain specified portion or part of the pixel area, e.g. in the center, of the sensor equipped with certain features or characteristics, for instance a high-resolution zoom-in in certain parts or areas of the sensor for security application, like for instance for luggage inspection.

| Pixel shape | size | | | | | | | | | |
|---|---|---|---|---|---|---|---|---|---|---|
| | 1 × 2 | 1 × 3 | 1 × 3 | 1 × 4 | 1 × 4 | 1 × 4 | 1 × 4 | 2 × 2 | 2 × 2 | 2 × 2 |
| Material/height A | 1 | 1 | 1 | 1 | 1 | 1 | 2 | 1 | 1 | 2 |
| MaterialB/height B | 1 | 1 | 2 | 1 | 1 | 3 | 2 | 1 | 1 | 2 |
| MaterialC/height C | | 1 | | 1 | 2 | | | 1 | 2 | |
| MaterialD/Height D | | | | 1 | | | | 1 | | |
| MaterialE/Height E | | | | | | | | | | |
| MaterialF/Height F | | | | | | | | | | |
| MaterialG/Height G | | | | | | | | | | |
| # subpixels | 2 | 3 | 3 | 4 | 4 | 4 | 4 | 4 | 4 | 4 |

| 2 × 3 | 2 × 3 | 2 × 3 | 2 × 3 | 2 × 3 | 2 × 3 | 2 × 3 | 2 × 3 | 2 × 3 | 3 × 3 | 4 × 4 | 5 × 5 | 6 × 6 |
|---|---|---|---|---|---|---|---|---|---|---|---|---|
| 1 | 1 | 1 | 1 | 1 | 2 | 2 | 2 | 3 | 1 | 1 | 1 | 1 |
| 1 | 1 | 1 | 1 | 1 | 1 | 1 | 4 | 3 | 2 | 2 | 2 | 2 |
| 1 | 1 | 2 | 1 | 4 | 1 | 3 | | | 2 | 3 | 4 | 3 |
| 1 | 1 | 2 | 3 | 1 | | | | | 4 | 4 | 6 | 4 |
| 1 | 2 | | | 1 | | | | | | 6 | 12 | 8 |
| 1 | | | | | | | | | | | | 18 |
| 6 | 6 | 6 | 6 | 6 | 6 | 6 | 6 | 6 | 9 | 16 | 25 | 36 |

It has to be noted that embodiments of the invention are described with reference to different subject matters. In particular, some embodiments are described with reference to method type claims whereas other embodiments are described with reference to the device type claims.

However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practicing the claimed invention, from a study of the drawings, the disclosure, and the appended claims.

In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A radiation detector, comprising:
   a substrate;
   a sensor coupled to the substrate, the sensor comprising:
      a first array of sensor pixels;
      a second array of signal read-out elements; and electronic circuitry configured to provide image data based on signals received from the signal read-out elements;

a transducer coupled to the substrate and to the sensor, the transducer comprising:
    a third array of subpixels, wherein at least two subpixels of the third array of subpixels are assigned to one sensor pixel of the first array of the sensor pixels, and wherein each of the subpixels comprises a radiation conversion material,
wherein the radiation conversion material of each of the subpixels includes at least one photoconductor, and
wherein a composition of the at least one photoconductor of the subpixels is varied between the at least two subpixels assigned to the one sensor pixel of the first array of the sensor pixels in at least one of 1) a doping level of the at least one photoconductor, 2) a doping material of the at least one photoconductor, and 3) a combination of doping materials of the at least one photoconductor.

2. The radiation detector according to claim 1, wherein at least one of the signal read-out elements is a photodiode and the radiation conversion material of each of the subpixels includes a scintillator; wherein a composition of the radiation conversion material and/or a thickness of the radiation conversion material is varied between the at least two subpixels assigned to one sensor pixel of the first array of the sensor pixels.

3. The radiation detector according to claim 2, wherein the composition of the radiation conversion material to be varied between the at least two subpixels assigned to one sensor pixel is at least one of a doping level of the radiation conversion material, a doping material, and a combination of doping materials.

4. The radiation detector according to claim 2, wherein the radiation conversion material is caesium iodide, optionally doped with thallium, lutetium iodide, optionally doped with cerium, gadolinium oxysulfide, optionally doped with terbium or optionally doped with praseodymium, calcium tungstate, lutetium-yttrium oxyorthosilicate, sodium iodide, zinc sulfide, lutetium gadolinium gallium garnet, yttrium aluminum garnet, or bismuth germanium oxide.

5. The radiation detector according to claim 1, wherein at least one of the signal read-out elements is a conductive electrode, and wherein a thickness of the photoconductor is varied between the at least two subpixels assigned to one sensor pixel.

6. The radiation detector according to claim 5, wherein the photoconductor is at least one of amorphous selenium, cadmium zinc telluride, cadmium telluride, perovskite, gallium arsenide, mercury(II)iodide, lead(II) oxide, thallium(I) bromide, and inorganic photoconductor nanoparticles embedded in an organic matrix.

7. The radiation detector according to claim 1, wherein the at least two subpixels assigned to one sensor pixel are at least one of a different dimension, a different size, different distance gaps, a different radiation conversion materials, and a different material composition between the subpixels.

8. The radiation detector according to claim 1, wherein the third array comprises a non-uniform distribution of at least one of the different dimension of the subpixels, the different size of the subpixels, the different distance gaps, the different radiation conversion materials of the subpixels, and the different material composition between the subpixels.

9. The radiation detector according to claim 1, wherein at least one of the first array of sensor pixels, the second array of signal read-out elements, and the third array of subpixels is a two-dimensional array.

10. The radiation detector according to claim 1, wherein at least one of the first array of sensor pixels, the second array of signal read-out elements, and the third array of subpixels is a one-dimensional array.

11. The radiation detector according to claim 1, wherein at least one of the second array of signal read-out elements and the third array of subpixels define a subarray scheme of the first array of sensor pixels.

12. The radiation detector according to claim 1, wherein at least one of the second array of signal read-out elements and the third array of subpixels are configured to provide at least one of a spatial resolution, a spectral energy resolution, a dynamic range, and a spectral energy range.

13. The radiation detector according to claim 1, wherein the substrate comprises a substantially flat shape or a substantially curved shape.

14. The radiation detector according to claim 1, wherein the substrate comprises at least one of silicon, glass, and a polymer foil.

* * * * *